United States Patent
Andersson

(10) Patent No.: US 11,055,175 B2
(45) Date of Patent: Jul. 6, 2021

(54) METHOD AND DEVICES FOR CREATING REDUNDANT BLOCK DEVICES USING MOJETTE TRANSFORM PROJECTIONS

(71) Applicant: ZEBWARE AB, Stockholm (SE)

(72) Inventor: Johan Andersson, Stockholm (SE)

(73) Assignee: ZEBWARE AB, Stockholm (SE)

( * ) Notice: Subject to any disclaimer, the term of this patent is extended or adjusted under 35 U.S.C. 154(b) by 0 days.

(21) Appl. No.: 16/826,831

(22) Filed: Mar. 23, 2020

(65) Prior Publication Data

US 2020/0301781 A1 Sep. 24, 2020

Related U.S. Application Data

(60) Provisional application No. 62/822,508, filed on Mar. 22, 2019.

(51) Int. Cl.
*G06F 11/00* (2006.01)
*G06F 11/10* (2006.01)
*H03M 13/15* (2006.01)

(52) U.S. Cl.
CPC ....... *G06F 11/1076* (2013.01); *H03M 13/154* (2013.01)

(58) Field of Classification Search
None
See application file for complete search history.

(56) References Cited

U.S. PATENT DOCUMENTS

| 9,846,613 | B2 * | 12/2017 | Arslan | G11B 20/1833 |
| 2005/0283652 | A1 * | 12/2005 | Chen | G06F 11/1076 714/6.12 |
| 2008/0126912 | A1 * | 5/2008 | Zohar | G06F 11/1076 714/763 |
| 2015/0154072 | A1 * | 6/2015 | Diamant | G06F 11/2094 714/6.24 |
| 2016/0254826 | A1 * | 9/2016 | David | H03M 13/611 714/758 |
| 2018/0048333 | A1 * | 2/2018 | Nilsson | H03M 13/2942 |
| 2018/0246784 | A1 * | 8/2018 | Nilsson | H03M 13/2906 |
| 2019/0050293 | A1 | 2/2019 | Resch | |
| 2019/0158120 | A1 * | 5/2019 | Andersson | H04L 67/1097 |
| 2019/0158124 | A1 | 5/2019 | Nilsson | |

FOREIGN PATENT DOCUMENTS

WO WO 2017/023199 A1 2/2017

OTHER PUBLICATIONS

J. Shen, K. Zhang, J. Gu, Y. Zhou and X. Wang, "Efficient Scheduling for Multi-Block Updates in Erasure Coding Based Storage Systems," in IEEE Transactions on Computers, vol. 67, No. 4, pp. 573-581, Apr. 1, 2018, doi: 10.1109/TC.2017.2769051. (Year: 2018).*

(Continued)

*Primary Examiner* — Daniel F. McMahon
(74) *Attorney, Agent, or Firm* — Oblon, McClelland, Maier & Neustadt, L.L.P.

(57) ABSTRACT

A device encodes data using Mojette Transform to a block device configuration, in order to generate encoded data. The device transmits the data to other devices. The other devices store the received information. The data stored in the other devices can be efficiently updated using partial update.

15 Claims, 12 Drawing Sheets

(56) References Cited

OTHER PUBLICATIONS

Extended European Search Report dated Aug. 19, 2020 in European Patent Application No. 20160320.6, 12 pages.
European Office Action dated Sep. 28, 2020 in European Patent Application No. 20160320.6, 2 pages.
Pertin, D., et al., "Performance evaluation of the Mojette erasure code for fault-tolerant distributed hot data storage", Arxiv.Org, Cornell University Library, 201 Library Cornell University, Apr. 27, 2015, XP080808751, pp. 1-5.

* cited by examiner

Device
1
2
3
4

| 2 | 3 | 5 | 7 | 4 | 3 |
|---|---|---|---|---|---|
| 9 | 1 | 3 | 5 | 7 | 4 |
| 7 | 4 | 2 | 1 | 9 | 8 |
|   |   |   |   |   |   |

P(1,1)     2  12  13  14  11  11  13  8

Device
1
2
3
4

Fig 1c

| Device | Blocks | | | | | | | | | | | Type |
|---|---|---|---|---|---|---|---|---|---|---|---|---|
| 1 | 0 | 0 | 0 | 0 | 0 | 0 | 0 | 0 | 0 | 0 | 0 | Data |
| 2 | 0 | 0 | 0 | 0 | 0 | 0 | 0 | 0 | 0 | 0 | 0 | Data |
| 3 | 0 | 0 | 0 | 0 | 0 | 0 | 0 | 0 | 0 | 0 | 0 | P(1, 1) |
| 4 | 0 | 0 | 0 | 0 | 0 | 0 | 0 | 0 | 0 | 0 | 0 | P(-1, 1) |

| Device | Blocks | | | | | | | | | | | Type |
|---|---|---|---|---|---|---|---|---|---|---|---|---|
| 1 | A | 0 | 0 | 0 | 0 | 0 | 0 | 0 | 0 | 0 | 0 | Data |
| 2 | 0 | 0 | 0 | 0 | 0 | 0 | 0 | 0 | 0 | 0 | 0 | Data |
| 3 | A | 0 | 0 | 0 | 0 | 0 | 0 | 0 | 0 | 0 | 0 | P(1, 1) |
| 4 | 0 | A | 0 | 0 | 0 | 0 | 0 | 0 | 0 | 0 | 0 | P(-1, 1) |

| Device | Blocks | | | | | | | | | | | Type |
|---|---|---|---|---|---|---|---|---|---|---|---|---|
| 1 | A | 0 | 0 | 0 | 0 | 0 | 0 | 0 | 0 | 0 | 0 | Data |
| 2 | B | 0 | 0 | 0 | 0 | 0 | 0 | 0 | 0 | 0 | 0 | Data |
| 3 | A | B | 0 | 0 | 0 | 0 | 0 | 0 | 0 | 0 | 0 | P(1, 1) |
| 4 | B | A | 0 | 0 | 0 | 0 | 0 | 0 | 0 | 0 | 0 | P(-1, 1) |

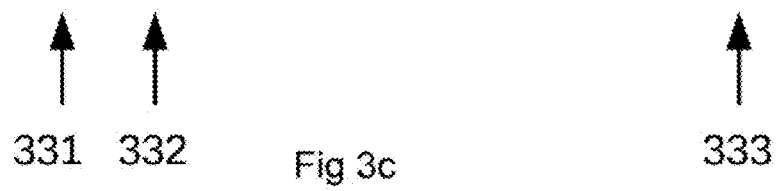
331 332    Fig 3c           333
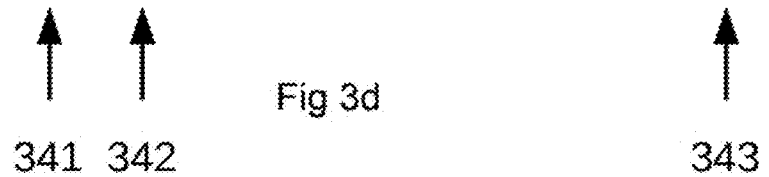
341 342    Fig 3d           343

| Device | Blocks | | | | | | | | | | | Type |
|---|---|---|---|---|---|---|---|---|---|---|---|---|
| 1 | A | C | E | 0 | 0 | 0 | 0 | 0 | 0 | S | 0 | Data |
| 2 | B | D | F | 0 | 0 | 0 | 0 | 0 | 0 | 0 | 0 | Data |
| 3 | A | B^C | D^E | F | 0 | 0 | 0 | 0 | 0 | S | 0 | P(1, 1) |
| 4 | B | A^D | C^F | E | 0 | 0 | 0 | 0 | 0 | 0 | S | P(-1, 1) |

411 412

| Device | Blocks | | | | | | | | | | | Type |
|---|---|---|---|---|---|---|---|---|---|---|---|---|
| 1 | A | C | E | 0 | 0 | 0 | 0 | 0 | 0 | S | 0 | Data |
| 2 | B | D | F | 0 | 0 | 0 | 0 | 0 | 0 | T | 0 | Data |
| 3 | A | B^C | D^E | F | 0 | 0 | 0 | 0 | 0 | S | T | P(1, 1) |
| 4 | B | A^D | C^F | E | 0 | 0 | 0 | 0 | 0 | T | S | P(-1, 1) |

421 422

| Device | Blocks | | | | | | | | | | Type |
|---|---|---|---|---|---|---|---|---|---|---|---|
| 1 | A | C | E | 0 | 0 | 0 | 0 | 0 | Q | S | 0 | Data |
| 2 | B | D | F | 0 | 0 | 0 | 0 | 0 | 0 | T | 0 | Data |
| 3 | A | B^C | D^E | F | 0 | 0 | 0 | 0 | Q | S | T | P(1, 1) |
| 4 | B | A^D | C^F | E | 0 | 0 | 0 | 0 | 0 | Q^T | S | P(-1, 1) |

431 432 433

| A | B | C | D | E | F | G | H | I | J | K | L | M | N | O | P | Q | R | S | T | U |

Fig 7a

| 1 | A | B | C | D | E | F | G |
|---|---|---|---|---|---|---|---|
| 2 | H | I | J | K | L | M | N |
| 3 | O | P | Q | R | S | T | U |

Fig 7b

| P(1,1) | A | B∧H | C∧I∧O | D∧J∧P | E∧K∧Q | F∧L∧R | G∧M∧S | N∧T | U | | |
| P(2,1) | A | B | C∧H | D∧I | E∧J∧O | F∧K∧P | G∧L∧Q | M∧R | N∧S | T | U |

Fig 7c

| A | X | Y | D | E | F | G | H | I | J | K | L | M | N | O | P | Q | R | S | T | U |

Fig 7d

| 1 | A | X | Y | D | E | F | G |
|---|---|---|---|---|---|---|---|
| 2 | H | I | J | K | L | M | N |
| 3 | O | P | Q | R | S | T | U |

Fig 7e

| P(1,1) | A | X∧H | Y∧I∧O | D∧J∧P | E∧K∧Q | F∧L∧R | G∧M∧S | N∧T | U | | |
| P(2,1) | A | X | Y∧H | D∧I | E∧J∧O | F∧K∧P | G∧L∧Q | M∧R | N∧S | T | U |

Fig 7f

| 1  | A | B | C | D | E | F | G |
|----|---|---|---|---|---|---|---|
| 1' | A | X | Y | D | E | F | G |

| P(1,1) | A | B∧H∧(B∧X) | C∧I∧O∧(C∧Y) | D∧J∧P | E∧K∧Q | F∧L∧R | G∧M∧S | N∧T | U |   |
|--------|---|-----------|-------------|-------|-------|-------|-------|-----|---|---|
| P(2,1) | A | B∧(B∧X)   | C∧H∧(C∧Y)   | D∧I   | E∧J∧O | F∧K∧P | G∧L∧Q | M∧R | N∧S | T | U |

Fig 7i

| P(1,1) | A | X∧H | Y∧I∧O | D∧J∧P | E∧K∧Q | F∧L∧R | G∧M∧S | N∧T | U |   |
|--------|---|-----|-------|-------|-------|-------|-------|-----|---|---|
| P(2,1) | A | X   | Y∧H   | D∧I   | E∧J∧O | F∧K∧P | G∧L∧Q | M∧R | N∧S | T | U |

Fig 7j

METHOD AND DEVICES FOR CREATING REDUNDANT BLOCK DEVICES USING MOJETTE TRANSFORM PROJECTIONS

CROSS-REFERENCE TO RELATED APPLICATIONS

This application claims the benefit of priority under 35 U.S.C. 119(e) to U.S. Application No. 62/822,508 entitled "Method and Devices for Creating Redundant Block Devices using Mojette Transform Projections," and filed on Mar. 22, 2019. The entire contents of U.S. Application No. 62/822,508 are incorporated herein by reference.

BACKGROUND

Field of the Invention

To treat a set of block devices as rows and projections in the Mojette Transform that implies a mapping between block device blocks and Mojette Transform pixels.

Description of the Related Art

Redundant Array of Independent Disks (RAID) is traditionally implemented in businesses and organizations where disk fault tolerance and/or optimized performance are necessary. Servers and Network Attached Storage (NAS) servers in business datacenters (DC) typically have a hardware RAID controller but a lot of today's implementations rely on software solutions for redundancy in both DC and consumer hardware.

Software RAID means you can setup RAID without a need for a dedicated hardware RAID controller. There are several RAID levels, and the one you choose depends on whether you are using RAID for performance and/or fault tolerance.

RAID level 5 is described herein as an example. RAID 5 is a common RAID configuration for business servers and enterprise NAS devices. This RAID can provide better performance and redundancy than mirroring as well as fault tolerance. With RAID 5, data and parity used for recovery are striped across three or more disks. If a disk gets an error or starts to fail, data is recreated from this distributed data and parity, seamlessly and automatically. The system is still operational even when one disk fails. Another benefit of RAID 5 is that it allows NAS and server drives to be "hot-swappable" meaning that in case of a drive failure, that drive can be swapped with a new drive without shutting down the server or NAS, and without having to interrupt users who may be accessing the server or NAS. RAID for fault tolerance is important because as drives fail, the data can be rebuilt to new disks as failing disks are replaced. The downside to today's standard RAID 5 is the performance hit to servers that perform a lot of write operations. For example, with RAID 5 on a server that has a database that many employees access on a workday, there could be noticeable lag. RAID is not a backup (BU), and does not replace a business strategy for Disaster Recovery (DR) or a data protection policy embracing regular controlled BU and DR tests.

Different algorithms can be used to create RAID functionality but the preferred algorithm is the Mojette Transform (MT) a discrete and exact version of the Radon Transform. The Mojette Transform is by nature a non-systematic code and the parity chunks have a larger size $(1+\varepsilon)$ than corresponding systematic chunks (k), where epsilon is $\varepsilon>0$ making the parity chunks (m) containing more information than data chunks. The Mojette Transform is by design highly performant also on CPUs without advanced acceleration features and delivers excellent results even on less potent CPUs, but takes full advantage of modern CPU features when present. MT is also portable between different hardware platforms, which means that it can be used in all architectural layers such as data centers, client applications and edge devices. MT is an algorithm that is rateless meaning that it is possible to set any redundancy level to a specific use case for optimal functionality, and add or reduce the redundancy level without noticeable performance impact when tiering the data from hot to cold storage or vice versa.

There is a need for an improved rateless RAID solution implemented in software or hardware. Redundant Block Devices using Mojette Transform Projections (RBD_MT) for the next generation of disks can communicate more like cloud native solutions and work in distributed frameworks over networks for high performance use-cases.

SUMMARY

The invention is to treat a set of block devices as rows and projections in the Mojette Transform (MT). This implies a mapping between block device blocks and Mojette Transform pixels. By running the Mojette Transform in Block-less mode, all padding is pushed to the end of the Mojette Transform block, therefore the Mojette Transform Near-Optimal property can be handled by reserving a fixed number of blocks at the end of each block device. Essentially this works as a rate-less RAID-4/5 (standard RAID levels). During block write operations Partial Update (PU) is used to reduce the number of blocks that needs to be touched to complete the operation. This works by computing the difference between the old block and the new block. The new block is written to the data device and the difference is used to patch the parity blocks on the parity devices. Blocks written to the data devices can be striped over all data devices to speed up both read and write operations. Note that block is an overloaded term in computer storage systems. In this document we refer to block devices which read and write blocks of data. Each block has the size of one sector. It is independent of the block size used by the file system layered on top of the block devices.

Exemplary aspects of the disclosure include a method for managing redundant block devices using Mojette Transform, where the method includes creating a mapping between a plurality of blocks in the redundant block devices and Mojette Transform pixels, and writing data into the plurality of blocks in a plurality of data disks. The method also includes calculating parity projections and transferring the parity projections into a plurality of respective blocks in the plurality of blocks using Mojette Transform projections, and updating data in one of the plurality of blocks and the respective parity projection based on an input from a user.

Exemplary aspects of the disclosure also include a non-transitory computer-readable medium encoded with computer-readable instructions that, when executed by processing circuitry, cause the processing circuitry to perform a method including creating a mapping between a plurality of blocks in the redundant block devices and Mojette Transform pixels, and writing data into the plurality of blocks in a plurality of data disks. The method also includes calculating parity projections and transferring the parity projections into a plurality of respective blocks in the plurality of blocks using Mojette Transform projections, and updating, data in one of the plurality of blocks and the respective parity projection based on an input from a user.

Exemplary aspects of the disclosure further include a device having circuitry that creates a mapping between a plurality of blocks in the redundant block devices and Mojette Transform pixels, and writes data into the plurality of blocks in a plurality of data disks. The circuitry also calculates parity projections and transfers the parity projections into a plurality of respective blocks in the plurality of blocks using Mojette Transform projections, and updates data in one of the plurality of blocks and the respective parity projection based on an input from a user.

BRIEF DESCRIPTION OF THE DRAWINGS

FIG. 1c shows a graphical representation for explaining the Mojette Transform according to exemplary aspects of the present disclosure;

FIG. 2 shows an Initial State of the Devices where all devices are zeroed out, including 4 devices, with two (2) for data and two (2) for parity in a 2+2 configuration according to exemplary aspects of the present disclosure;

FIG. 3a shows the 4 devices in a Block Sequential Write (BSW) to block 1:1 represented by A according to exemplary aspects of the present disclosure;

FIG. 3b shows the 4 devices in a Block Sequential Write (BSW) to block 2:1 represented by B according to exemplary aspects of the present disclosure;

FIG. 3c shows the 4 devices in a Block Sequential Write (BSW) to block 1:2 represented by C according to exemplary aspects of the present disclosure;

FIG. 3d shows the 4 devices in a Block Sequential Write (BSW) to block 2:2 represented by D according to exemplary aspects of the present disclosure;

FIG. 7a illustrates the source data for a PU example having 21 pixels according to exemplary aspects of the present disclosure;

FIG. 7b illustrates the 7a source data put into a 3 row matrix with 7 pixels per row according to exemplary aspects of the present disclosure;

FIG. 7c illustrates the Mojette Transform on the matrix calculating projection P(1,1) and P(2,1), where the ^-operator here is a XOR operation according to exemplary aspects of the present disclosure according to exemplary aspects of the present disclosure;

FIG. 7d illustrates a partially updated source data where grey area denotes the partial updated part of the source code according to exemplary aspects of the present disclosure.

FIG. 7e illustrates the 3 row matrix with the partially updated source data inserted with the resulting data chunks, row one is here the new data chunk indicated by the denoted grey area according to exemplary aspects of the present disclosure.

FIG. 7f illustrates the Mojette Transform on the matrix calculating partially updated projection P(1,1) and P(2,1) on the partial updated source code according to exemplary aspects of the present disclosure;

FIG. 7g illustrates row one k data chunk before and after the partial update of the source data according to exemplary aspects of the present disclosure;

FIG. 7h illustrates the calculation of the difference between the original first row k data chunk and the new partially updated k data chunk according to exemplary aspects of the present disclosure;

FIG. 7i illustrates when the difference between original row one k data chunk and partial updated k data chunk is applied to the MT projections P(1,1) and P(2,1) according to data index and projection angle according to exemplary aspects of the present disclosure;

FIG. 7j illustrates the result of the MT PU update with only a partial update of the source code including updated data in the two m parity chunks P(1,1) and P(2,1) according to exemplary aspects of the present disclosure.

DETAILED DESCRIPTION

The embodiments described above are merely given as examples, and it is understood that the proposed technology is not limited thereto. It is understood by those skilled in the art that various modifications, combinations and changes may be made to the embodiments without departing from the present scope as defined by the appended claims. In particular, different part solutions in the different embodiments can be combined in other configurations, where technically possible.

In the examples of the Redundant Block Devices using Mojette Transform Projections (RBD_MT), a 2+2 configuration (2 data devices and 2 parity devices) is used. Shaded cells indicated by, for example 311 and 312 in FIG. 3a are blocks that have been touched by an operation. As shown in FIG. 1b, shaded cells indicated by, for example 201 in FIG. 1b, indicate reserved blocks.

Figure 1A:
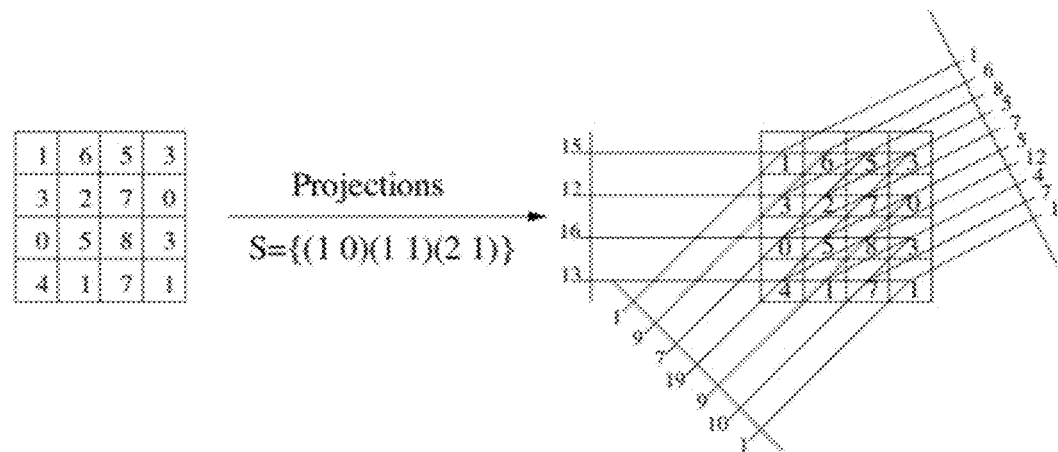
FIG. 1a shows a graphical illustration of the Mojette Transform, including a 4×4 block with three projections calculated according to exemplary aspects of the present disclosure.
Figure 1B:
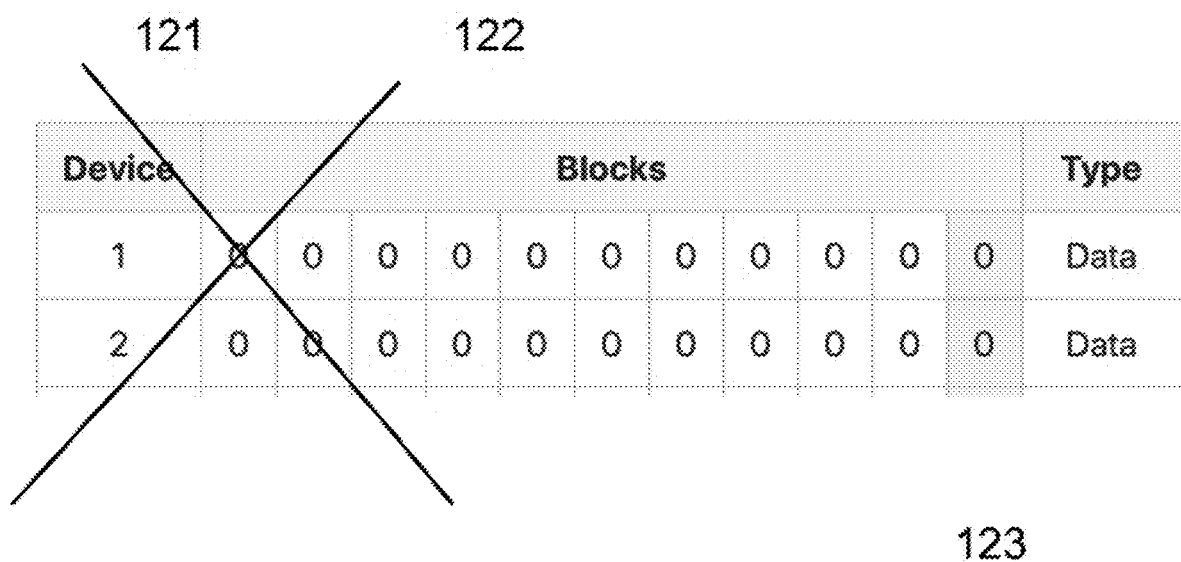
FIG. 1b shows a graphical representation of a 2 devices/rows Mojette Transform showing two projections 005 p(1,1) and 006 p(−1,1) according to exemplary aspects of the present disclosure.

FIG. 1c illustrates operation of the Mojette transform (MT) according to exemplary aspects of the present disclosure. The Mojette transform operator, or the Mojette projection operator, is applied to a two-dimensional representation of data. Consider the fact that a two-dimensional array, having a function f(k,l) where k and l denote discrete elements of the array, such as pixels. In a two-dimensional array k and l are the columns and rows of the array, respectively. The Mojette transform, or operator, is defined as:

$$M\{f(k,l)\} \equiv \text{proj}(p_i, q_i, a) = \Sigma_{k=0}^{Q-1} \Sigma_{l=0}^{P-1} f(k,l) \delta(a + p_i l - q_i k) \quad (1)$$

The summation indices P and Q correspond to the size of the data block. That is, the data is provided as a block with dimensions P×Q. The variable a is a value that specifies a line and is given by:

$$a = p_i l - q_i k \quad (2)$$

The line specified by a is a line over which the elements, or pixels, of the block are centered. Applying the Mojette transform operator to a particular data block leads to a sim over the elements or pixels that are centered about a particular line, where the particular line can be inferred from the Kronecker delta function:

$$a = p_i l - q_i k \quad (3)$$

If a=0, and 0 otherwise, in the above equation, a can be removed from the argument in the following equation:

$$\text{proj}(p_i, q_i, a) \quad (4)$$

Thus, the projection can simply be denoted by (pi,qi). The formula (1) above can then be used to generate a projection with any value of p and q. The number B of line sums, also referred to as the number of bins, per projection is given by:

$$B = (Q-1)|p| + (P-1)|q| + 1 \quad (5)$$

Examples of how projections are used in the inventive concepts described herein are described below.

Returning to FIG. 1c, three devices use a fourth device for redundancy, and calculate two extra blocks using formula (5) above. The results are as follows:

$P = 6$ $Q = 3$ $P(1,1)$ $p=1$ and $q=1$ $B = (Q-1)|p| + (P-1)|q| + 1 = (3-1)*1 + (6-1)*1 + 1 = 8$ Extra blocks for $P(1,1)$, $B - P = 8 - 6 = 2$ In order to set the device to the correct configuration, the steps described in the table labeled "Configuration of Block Device," below must be performed as described in greater detail herein.

The basics of the MT include an equation for the configuration of a block to be used with a set of MT projections. In FIG. 1b a projection p(p,q)=(1,1) 006 is shown. If this projection is used for a configuration having two data disks as in FIG. 1b, the number of extra blocks 007 will be one (1). This can be calculated by subtracting Q from the number of bins (elements of projections). For example, using equation 3 where P=2 and Q=10 giving a total of bins=11, the Extra Rows=bins−Q=11−10=1, which provides a basis for the FIG. 1b extra block 007. If a different projection or projections are to be used the projection giving the largest number of extra bins may be found and this projection then dictates the number of extra blocks 007.

In FIG. 2 the above configuration is used for two parity disks using projections p(1,1) and p(−1,1) both having the same number of FIG. 1b extra blocks 007, one (1). All blocks are zeroed out after a configuration of the disks is done. The configuration of disks in FIG. 2 performs the following steps, as described in the Table below.

TABLE

| Configuration of block device | | |
| --- | --- | --- |
| Step | Action | Comment |
| 1 | Input number of data disks to be used | |
| 2 | Input number of redundancy disks to be used | |
| 3 | Input MT configuration to be used | Projections |
| 4 | Find smallest disk given and calculate number of blocks | |
| 5 | Calculate number of extra blocks for given inputs | |
| 6 | Check that given MT configuration is OK | Adjust to smaller number of blocks if necessary or give new input |
| 7 | Zero out all disks to given configuration | |

An example is provided for each of the different cases including Block Sequential Writes (BSW) to the RBD_MT, Block Random Write, and Block Update.

FIG. 3a shows the 4 devices in a Block Sequential Write (BSW) to block 1:1 represented by A, where the MT has calculated the block configuration parity blocks for projection p(1,1) to block 3:1 and p(−1,1) to block 4:2.

FIG. 3b shows the 4 devices in a Block Sequential Write (BSW) to block 2:1 represented by B, where the MT has calculated the block configuration parity blocks for projection p(1,1) to block 3:2 and p(−1,1) to block 4:1.

FIG. 3c shows the 4 devices in a Block Sequential Write (BSW) to block 1:2 represented by C, where the MT has calculated the block configuration parity blocks for projection p(1,1) to block 3:2 using the ^-operator which is an XOR operation together with the present B and p(−1,1) to block 4:3.

FIG. 3d shows the 4 devices in a Block Sequential Write (BSW) to block 2:2 represented by D, where the MT has calculated the block configuration parity blocks for projection p(1,1) to block 3:3 and p(−1,1) to block 4:2 where an XOR operation is performed A^D.

Figure 3E:
FIG. 3e shows the 4 devices in a Block Sequential Write (BSW) to block 1:3 represented by E according to exemplary aspects of the present disclosure.

FIG. 3e shows the 4 devices in a Block Sequential Write (BSW) to block 1:3 represented by E, where the MT has calculated the block configuration parity blocks for projection p(1,1) to block 3:3 with an XOR operation D^E and p(−1,1) to block 4:4.

Figure 3F:
FIG. 3f shows the 4 devices in a Block Sequential Write (BSW) to block 2:3 represented by F according to exemplary aspects of the present disclosure.

FIG. 3f shows the 4 devices in a Block Sequential Write (BSW) to block 2:3 represented by F, where the MT has calculated the block configuration parity blocks for projection p(1,1) to block 3:4 and p(−1,1) to block 4:3 with an XOR operation C^F.

Data can be written using BSW until the devices are full using the same block MT configuration.

Figure 4A:
FIG. 4a shows the 4 devices in a Block Random Write (BRW) to block 1:10 represented by S according to exemplary aspects of the present disclosure.
Figure 4B:
FIG. 4b shows the 4 devices in a Block Random Write (BRW) to block 2:10 represented by T according to exemplary aspects of the present disclosure.
Figure 4C:
FIG. 4c shows the 4 devices in a Block Random Write (BRW) to block 1:9 represented by Q according to exemplary aspects of the present disclosure.

Random writes to the same configured RBD_MT are performed with reference to FIGS. 4a, 4b, and 4c.

FIG. 4a shows the 4 devices in a Block Random Write (BRW) to block 1:10 represented by S, where the MT has calculated the block configuration parity blocks for projection p(1,1) to block 3:10 and p(−1,1) to block 4:11.

FIG. 4b shows the 4 devices in a Block Random Write (BRW) to block 2:10 represented by T, where the MT has calculated the block configuration parity blocks for projection p(1,1) to block 3:11 and p(−1,1) to block 4:10.

FIG. 4c shows the 4 devices in a Block Random Write (BRW) to block 1:9 represented by Q, where the MT has calculated the block configuration parity blocks for projection p(1,1) to block 3:9 and p(−1,1) to block 4:10 with an XOR operation Q^T.

These random writes can then continue to fill the disks/memory until full, which means all blocks contain written information/data.

Block Update is described with reference to FIGS. 5a and 5b.

Figure 5A:
FIG. 5a shows the 4 devices in a Block Update to block 1:5 represented by X according to exemplary aspects of the present disclosure.

FIG. 5a shows a fully written block device having A-T written into all available blocks on the data disks and parity projections calculated and transferred into each respective block using MT with the block configuration 2+2 and p(1,1), p(−1,1). In FIG. 5a the block that contains "I" 1:5 is updated to "X," the respective parity blocks for p(1,1) 3:5 with an XOR operation is updated to H^X, and parity block for p(−1,1) 4:6 with an XOR operation is updated to X^L.

Figure 5B:
FIG. 5b shows the 4 devices in a Block Update to block 2:5 represented by Y according to exemplary aspects of the present disclosure.

FIG. 5b shows a fully written block device having A-T with I updated to X written into all available blocks on the data disks and parity projections calculated and transferred into each respective block using MT with the block configuration 2+2 and p(1,1), p(−1,1). In FIG. 5b, the block that contains "J" 2:5 is updated to "Y," the respective parity blocks for p(1,1) 3:6 with an XOR operation is updated to Y^K, and parity block for p(−1,1) 4:5 with an XOR operation is updated to G^Y.

Updating of written blocks can continue until the disks/memory are full.

Figure 6:
FIG. 6 shows a table for Partial Update (PU) of a block. The table visualizes the benefit of using Partial Update. There is no need to read block 2:1 or 2:3 according to exemplary aspects of the present disclosure.

The table in FIG. 6 visualizes the benefit of using Partial Update (PU). In this example there is no need to read block 2:1 or 2:3 (B and F) to recompute the parity blocks. Using the old data block (C) and the new data block (X), the difference (C^X) can be computed. This difference is then used to patch the two parity blocks. Therefore, to update a single block, 1 block difference computation, M block patch computations, M+1 reads and M+1 writes need to be performed.

For example, Block 1:2 is updated from C to X. The difference is computed to C^X. And parity blocks 3:2 and 4:3 are patched with the computed difference. The result is B^X and X^F respectively.

Partial update (PU) of a block is an important feature to reduce the number of operations necessary when the RBD_MT is used. This example shows that a general partial update (PU) of MT coded data reduces the number of operations needed when re-encoding parity chunks after an update to one or more data chunks. If data chunks are transmitted to the machine performing the re-encode, it will also reduce the network traffic since less data chunks need to be transmitted over the network. In FIG. 7a, data code is represented from A to U. This data can then be used by an application on computer hardware and an update to the data is made only affecting parts of the data code in FIG. 7a. FIG. 7b shows a matrix having k=3 and m=2 where k is number of rows and m is number of redundancy projections. Projections p(1,1) and p(2,1) are shown in FIG. 7c. In FIG. 7c the MT operation is also performed. Specifically, XOR operations are performed to the data. In FIG. 7d, an update of a part of the data is made by a user, denoted with X and Y. FIG. 7e shows the location of the update in the matrix and that this data is located in row one. FIG. 7f shows, after MT operations, the updated projections p(1,1) and p(2,1), and the bins where X and Y are present is indicated. In FIG. 7g the difference between row original and updated is shown. In FIG. 7h, the difference between the chunks of row one is calculated. In FIG. 7i, the difference from FIG. 7h is inserted into the two projections p(1,1) and p(2,1) and the updated difference is calculated for the updated bins. In FIG. 7j, the final result of the PU using MT operations is shown and the updated bins for each projection is marked.

Figure 8:
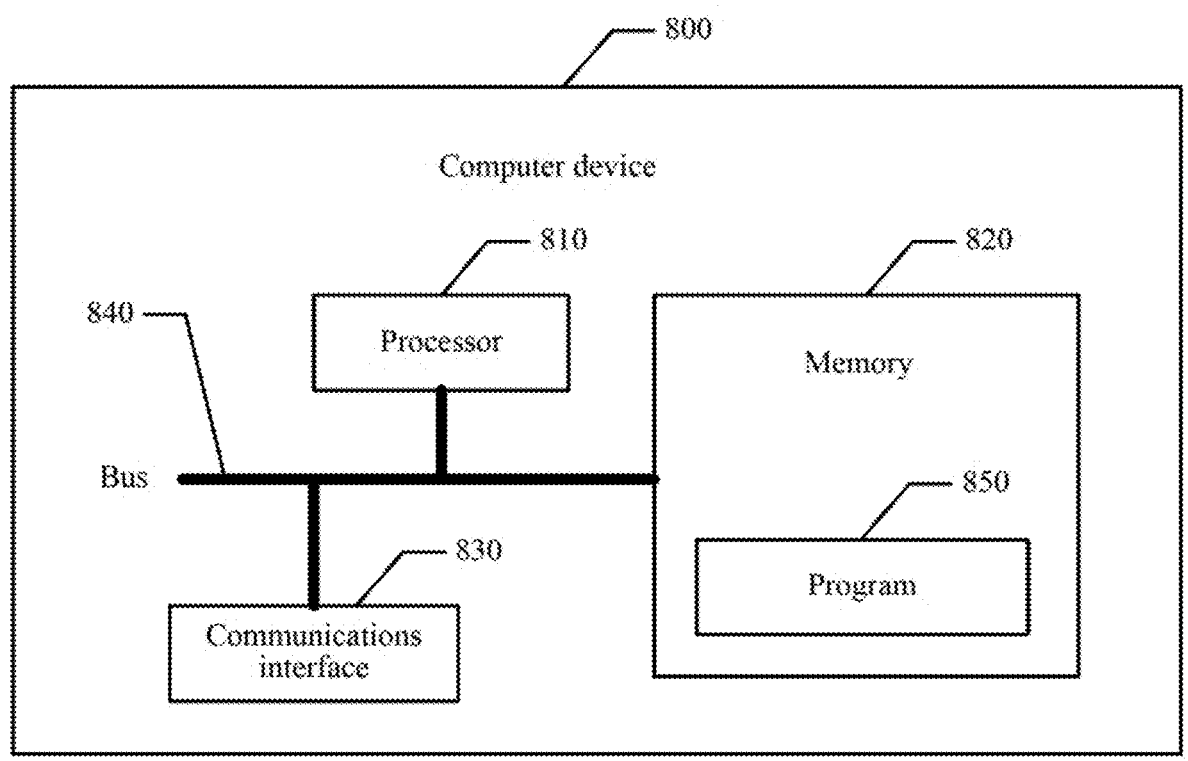
FIG. 8 is a schematic illustration of a computer implementation according to an embodiment of the present disclosure.

Referring to FIG. 8, an embodiment of the present disclosure further provides a computer device 800, including circuitry such as a processor 810, a memory 820, a communications interface 830 all of which are interconnected by a bus 840.

The memory 820 is stores a program 850, and the processor 810 is connected to the memory 820 by using the bus 840. When the computer device 800 is running, the processor 810 executes the program 850 stored in the memory 820, so that the computer device 800 performs the functions described above. The processor 810 is configured to perform the functions described above, with reference to other Figures.

The memory 820 may include a high-speed random access memory (RAM) memory. Optionally, the memory 820 may further include a non-volatile memory. For example, the memory 820 may include a magnetic disk memory.

The processor 810 may be a central processing unit (CPU), or the processor 810 may be an application-specific integrated circuit (ASIC), or the processor 810 may be one or more integrated circuits configured to implement the embodiments of the present disclosure.

A person of ordinary skill in the art may understand that all or some of the steps of the methods in the embodiments may be implemented by a program instructing relevant hardware. The program may be stored in a computer readable storage medium, such as a non-transitory computer readable storage medium. The storage medium may include a Read Only Memory (ROM), a RAM, a magnetic disk, or an optical disc.

FIG. 9 illustrates a system according to exemplary aspects of the present disclosure. The system of FIG. 9 includes device 900, device 915, device 920, and device 925, which correspond to the devices discussed relative to FIGS. 3-6. Each of the devices 900, 915, 920, and 925 may include a disk 905, which can be an optical disk or a magnetic disk, as well as control circuitry 910 to control the operation of the disk and the device. The control circuitry can take the form of the circuitry discussed above relative to the computer device 800 illustrated in FIG. 8.

The devices 900, 915, 920, and 925 are connected to a network 930, which can be a wireless network (cellular or wifi) or a wired network, or any combination thereof. The network 930 may also include private networks, public networks, such as the Internet, or any combination thereof. As can be appreciated, the make-up of the network 930 does not limit the present disclosure, which is applicable to any network configuration.

A computer device 935 is also connected to the network 930 in order to communicate with the devices 900, 915, 920, and 925 and to carry out the functions described above.

The embodiments described above are merely given as examples, and it is understood that the proposed technology is not limited thereto. It can be understood by those skilled in the art that various modifications, combinations and changes may be made to the embodiments without departing from the present scope as defined by the appended claims. In particular, different part solutions in the different embodiments can be combined in other configurations, where technically possible.

The invention claimed is:

1. A method for managing redundant block devices using a Mojette Transform, the method comprising:
   creating a mapping between a plurality of blocks in the redundant block devices and Mojette Transform pixels;

writing data into the plurality of blocks in a plurality of data disks;

calculating parity projections and transferring the parity projections into a plurality of respective blocks in the plurality of blocks using Mojette Transform projections; and updating data in one of the plurality of blocks and the respective parity projection based on an input from an user.

2. The method according to claim 1, further comprising:
determining a smallest of the plurality of disks; and
calculating a number of the plurality of blocks based on the smallest of the plurality of disks.

3. The method according to claim 1, further comprising verifying the data and the parity projections calculated using the Mojette transform.

4. The method according to claim 1, further comprising configuring the redundant block devices based on at least a number of redundant block devices used, and a number of projections used.

5. The method according to claim 4, wherein configuring the redundant block devices includes writing all memory locations in the redundant block devices with a zero value.

6. A device for managing a plurality of redundant block devices, comprising:
circuitry configured to:
create a mapping between a plurality of blocks in the redundant block devices and Mojette Transform pixels,
write data into the plurality of blocks in a plurality of data disks,
calculate parity projections and transferring the parity projections into a plurality of respective blocks in the plurality of blocks using Mojette Transform projections, and
update data in one of the plurality of blocks and the respective parity projection based on an input from an user.

7. The device according to claim 6, wherein the circuitry is further configured to:
determine a smallest of the plurality of disks; and
calculate a number of the plurality of blocks based on the smallest of the plurality of disks.

8. The device according to claim 6, wherein the circuitry is further configured to verify the data and the parity projections calculated using the Mojette transform.

9. The device according to claim 6, wherein the circuitry is further configured to:
configure the redundant block devices based on at least a number of redundant block devices used, and a number of projections used.

10. The device according to claim 9, wherein, in configuring the redundant block devices, the circuitry is further configured to write all memory locations in the redundant block devices with a zero value.

11. A non-transitory computer-readable medium encoded with computer-readable instructions that, when executed by a computer, cause the computer to perform a method comprising:
creating a mapping between a plurality of blocks in the redundant block devices and Mojette Transform pixels;
writing data into the plurality of blocks in a plurality of data disks;
calculating parity projections and transferring the parity projections into a plurality of respective blocks in the plurality of blocks using Mojette Transform projections; and
updating data in one of the plurality of blocks and the respective parity projection based on an input from an user.

12. The non-transitory computer-readable medium according to claim 11, further comprising:
determining a smallest of the plurality of disks; and
calculating a number of the plurality of blocks based on the smallest of the plurality of disks.

13. The non-transitory computer-readable medium according to claim 11, further comprising verifying the data and the parity projections calculated using the Mojette transform.

14. The non-transitory computer-readable medium according to claim 11, further comprising configuring the redundant block devices based on at least a number of redundant block devices used, and a number of projections used.

15. The non-transitory computer-readable medium according to claim 14, wherein configuring the redundant block devices includes writing all memory locations in the redundant block devices with a zero value.

* * * * *